(12) United States Patent
Roumanie et al.

(10) Patent No.: US 11,955,375 B2
(45) Date of Patent: Apr. 9, 2024

(54) COMPOSITE STRUCTURE, INTENDED FOR A PLANAR CO-INTEGRATION OF ELECTRONIC COMPONENTS OF DIFFERENT FUNCTIONS

(71) Applicant: COMMISSARIAT À L'ENERGIE ATOMIQUE ET AUX ENERGIES ALTERNATIVES, Paris (FR)

(72) Inventors: Marilyne Roumanie, Grenoble (FR); Christelle Navone, Grenoble (FR); Lamine Benaissa, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 74 days.

(21) Appl. No.: 17/722,626

(22) Filed: Apr. 18, 2022

(65) Prior Publication Data

US 2022/0336266 A1 Oct. 20, 2022

(30) Foreign Application Priority Data

Apr. 16, 2021 (FR) .................... 21/03985

(51) Int. Cl.
H01L 21/762 (2006.01)
H01L 23/66 (2006.01)
H01L 27/12 (2006.01)
H01L 23/00 (2006.01)

(52) U.S. Cl.
CPC .. *H01L 21/76275* (2013.01); *H01L 21/76283* (2013.01); *H01L 27/1203* (2013.01); *H01L 23/66* (2013.01); *H01L 24/83* (2013.01); *H01L 2224/83896* (2013.01)

(58) Field of Classification Search
CPC .......... H01L 21/76283; H01L 27/1203; H01L 21/02002; H01L 21/02109; H01L 21/76275
USPC .......................................... 257/347; 438/149
See application file for complete search history.

(56) References Cited

U.S. PATENT DOCUMENTS

| | | |
|---|---|---|
| 2011/0073236 A1 | 3/2011 | Lee |
| 2017/0062357 A1 | 3/2017 | Kamgaing et al. |
| 2018/0171185 A1* | 6/2018 | Roumanie et al. ...... C09J 11/04 |
| 2020/0365532 A1 | 11/2020 | Male et al. |

* cited by examiner

Primary Examiner — Thinh T Nguyen
(74) Attorney, Agent, or Firm — Oliff PLC

(57) ABSTRACT

A composite structure, intended for a planar co-integration of electronic components of different functions, the composite structure including from its base towards its surface: a support substrate made of a first material, the support substrate including cavities each opening into an upper face of the support substrate, the cavities being filled with at least one composite material consisting of a matrix of a cross-linked preceramic polymer, the matrix being charged with inorganic particles; and a thin film made of a second material, the thin film being bonded to the upper face of the support substrate and to the composite material.

7 Claims, 3 Drawing Sheets

[Fig. 1]
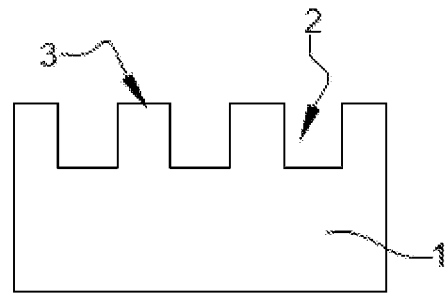
[Fig. 2]
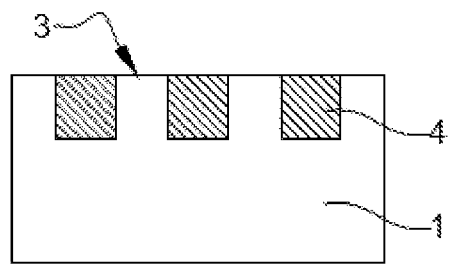
[Fig. 3]
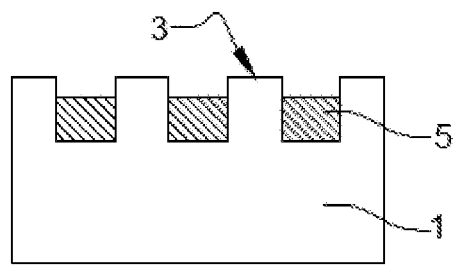
[Fig. 4]
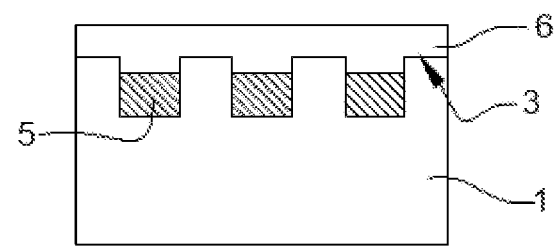

[Fig. 5]
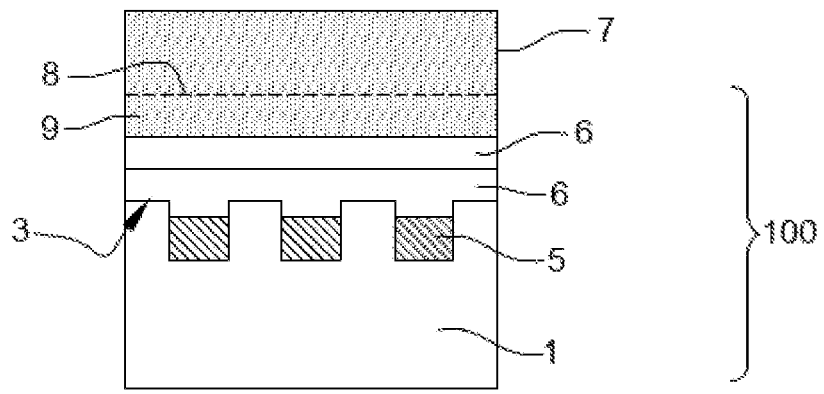
[Fig. 6]
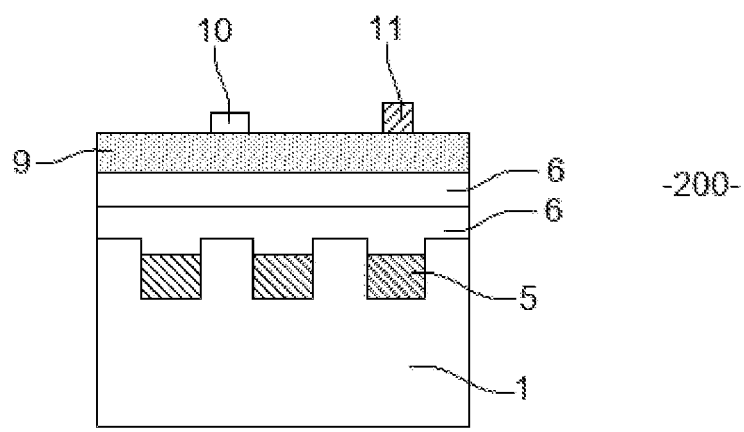
[Fig. 7]
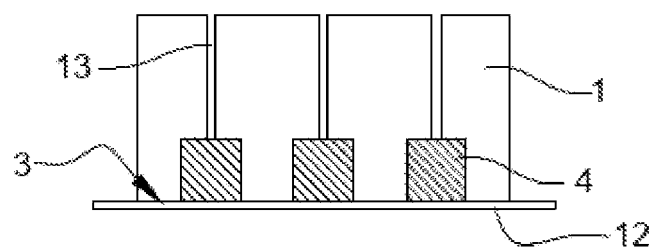

[Fig. 8]
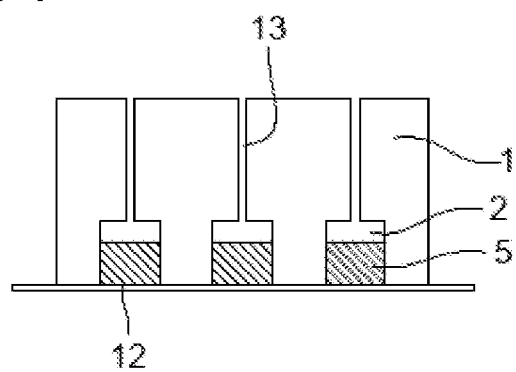
[Fig. 9]
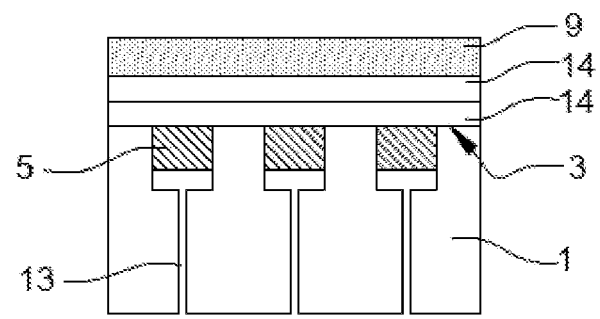

COMPOSITE STRUCTURE, INTENDED FOR A PLANAR CO-INTEGRATION OF ELECTRONIC COMPONENTS OF DIFFERENT FUNCTIONS

The present invention relates to advanced substrates for the field of microelectronics, photonics, and power electronics. In particular, the present invention concerns a composite structure, intended for a planar co-integration of electronic components of different functions, and a method for manufacturing the same.

In order to improve the performances of electronic devices, the manufacturing technology of CMOS (Complementary Metal Oxide Semiconductor) electronic components has progressively turned away from the use of bulk substrates to head towards thin film substrates, reported via a buried oxide layer, allowing for a better electrostatic control of the channel of the MOS transistors by avoiding leakage currents. Nonetheless, this FDSOI (Fully Depleted Silicon On Insulator) technology is limited when it is desirable to place several transistors on a same substrate. Indeed, it is necessary to create STI (Shallow Trench Isolation) isolation trenches in the substrate between each of the transistors. In addition, when it is desired to altera components of different functions, for example a vertical conduction transistor and an RF (Radio Frequency) sensor on a same substrate, the requirements relating to the properties of the integration substrate differ. The transistor will need a conductive substrate while the RF sensor will need an electrically-insulating substrate having a good thermal conductivity and capable of limiting RF losses.

To take these constraints into consideration, a known method consists in the use of discrete components, on a clean substrate. Each of the components (RF components and transistors) is then produced on a specific and different substrate. Then each component is cut to be removed and then transferred to a support and connected, which is time-consuming and expensive.

One of the aims of the present invention is to overcome at least one of these drawbacks. To this end, the present invention provides a composite structure, intended for a planar co-integration of electronic components of different functions, the composite structure comprising from its base towards its surface:

- a support substrate made of a first material, the support substrate including cavities each opening into an upper face of the support substrate, the cavities being filled with at least one composite material consisting of a matrix of a crosslinked preceramic polymer, the matrix being charged with inorganic particles,
- a thin film made of a second material, the thin film being bonded to the upper face of the support substrate and to the composite material.

Configured in this manner, the composite structure of the present invention has a support substrate comprising an alternation of regions consisting of different materials with equally different properties. Indeed, the support substrate comprises regions including a composite material whose particles allow modulating its properties, in particular its electrical conductivity. Also, the overlying thin film enables the integration in the plane of several electronic components with different needs and operations, depending on whether it is above the first material or the composite material. This allows optimizing the operation of each of the components, and to limit the necessary manufacturing time period compared to the prior art when the different components are manufactured on different substrates and then transferred on a single support. Moreover, the choice of a composite material formed from a preceramic polymer allows guaranteeing an absence of disintegration or decomposition during subsequent stages of manufacturing or of use of the structure at high temperature. Indeed, after the crosslinking treatment, the shaped preceramic polymer becomes infusible.

Advantageously, the cavities of a same support substrate may be filled with different natures of composite materials both in terms of preceramic polymer and in terms of nature and combination of inorganic particles. Thus, the composite structure may be entirely designed by adapting the properties of the composite material in the cavities according to the requirements of the components to be integrated.

According to one arrangement, the cavities have a depth larger than or equal to 10 micrometers, in particular larger than or equal to 50 micrometers and for example about 100 micrometers.

This depth advantageously overcomes the effect of the support substrate located directly under the cavities. These dimensions are far from those obtained with conventional microelectronics technologies (by CVD, PVD-evaporation, etc.) where the thicknesses are generally smaller than 5 µm, which makes the composite structure of the present invention more efficient.

According to one possibility, the cavities have a width ranging from 100 micrometers to 1 mm. These dimensions are accessible by the usual technologies of microelectronics.

Advantageously, the cavities have a variable overall shape, such as a polygon, a cylinder, etc., shape, they may have a circular cross-section of variable dimensions, etc., the shape of the cavity being configured to enable filling from a liquid or solid filling formulation by conventional techniques.

According to one arrangement, the preceramic polymer is a silicon-based polymer. The preceramic polymer is preferably selected from the group comprising a polysiloxane, a polysilsesquioxane, a polycarbosiloxane, a polycarbosilane, a polysilylcarbodiimide, a polysilsesquicarbodiimide, a polysilsesquiazane, a polysilazane, a polyborosilazane, a polyborosilane, a polyborosiloxane and a combination of these polymers. The choice of the nature of the preceramic polymer depends on the properties targeted for the desired composite structure and its compatibility with the substrate on which it is deposited. It is also chosen so that once charged and crosslinked, the resulting composite material has a coefficient of thermal expansion close to that of the thin film preferably composed of silicon.

The preceramic polymer has an excellent resistance to temperature (for example, in the form of an adhesive, it withstands temperatures above 350° C.). This enables the transferred thin layer to undergo heat treatments at high temperature, such as curing defects generated by the implantation in the donor substrate for example. Indeed, a preceramic polymer is an organic/inorganic polymer which is generally used in order to produce, after heat treatment at high temperature, ceramic objects called PDC (acronym for «Polymer Derived Ceramics».

Such a preceramic polymer may be applied in various forms and may therefore be easily used to charge cavities with the aforementioned dimensions. It is in the form of a liquid or is soluble in organic solvents and may be deposited on a substrate by a liquid, solid process or by vapor phase.

It is possible to use all polymer shaping techniques such as spin coating, dip coating, spraying or strip casting, screen-printing, inkjet printing.

According to one possibility, the matrix is charged with one or several type(s) of inorganic particles, selected from:
- a thermal conductor, such as SiC,
- an electrical insulator, such as AlN, $Si_3N_4$, crystalline $Al_2O_3$ or BN,
- an electrical conductive metal, such as Cu, Ag, Au or Al,
- a magnetic material, such as NdFeB, ZnMn or NiZn ferrite,
- a material with an optical property, in particular CdSe in the form of 2 to 8 nm nanoparticles, so as to obtain fluorescence or graphite properties for reflection properties,
- and a combination of these different types of inorganic particles.

This wide range of particles provides access to a large number of composite materials with very varied properties. This allows a very good adaptation to the needs of the different electronic components to be integrated. Indeed, the choice of these inorganic particles allows conferring on the composite material respectively properties of thermal conductivity, electrical insulation, electrical conductivity, magnetic properties and/or optical properties different from those of the preceramic polymer and of the first material.

It is also possible to use matrices containing several sizes and shapes of inorganic particles to promote percolation paths.

Preferably, the matrix is obtained from a filling formulation, comprising between 20% and 50% by volume of a preceramic polymer and a charge rate of inorganic particles ranging from 50 and 80% by volume with respect to the total volume of the filling formulation.

In the case of inorganic particles of SiC (density 3.21), the mass ratio of SiC varies within a range ranging from 71 to 91% for a weight of preceramic polymer ranging from 9 to 29%.

These particles are preferably mixed with the matrix so that the filling formulation has a sufficient charge rate to obtain the desired properties and to obtain an integrated layer depending on the thickness of the deposit and the working temperature.

According to one possibility, the thin film is bonded to the upper face of the support substrate and to the composite material by means of an adhesion primer. The adhesion primer is thus placed between the upper face of the support substrate (and an exposed surface of the composite material filling the cavities) and the thin film.

The adhesion primer of the present invention is a preceramic polymer whose viscosity is adapted by means of shaping. It does not degrade or decompose at high temperatures and is compatible for use in the manufacture of electronic devices. A solvent may be added to modulate the viscosity. It may be deposited by dispensing with inkjet or by screen-printing. In the case where the preceramic polymer is solid (initially or partially crosslinked), it has thermoplastic behavior. The adhesion primer is thus capable of being softened, at least on the surface, which allows bonding to the donor substrate of the thin film.

Advantageously, the used adhesion primer is of the same nature as the preceramic polymer used for the matrix. This adhesion primer then has the advantage of being compatible with the matrix and promoting a good adhesion. It is selected from polysiloxanes which are advantageously compatible with the surface of a silicon substrate and at high temperatures since they transform into ceramics.

Preferably, the adhesion primer is selected from SILRES® H62 C (phenyl silicone resin) and SILRES® MK (methyl silicone resin) available from the supplier Wacker Chemie AG.

According to another aspect, the present invention provides a micro-electronic system with a planar co-integration comprising:
- a composite structure as previously described
- a plurality of electronic components of different functions on the thin film, comprising:
  - passive electronic components, such as RF components, for example sensors, formed on the first regions of the exposed surface of the thin film located directly above the composite material filling the cavities of the support substrate,
  - active electronic components, such as transistors associated with RF components, formed on second regions of the exposed surface of the thin film located directly above the first material of the support substrate,
- the inorganic particles of the matrix consist of SiC and/or $Si_3N_4$ to give thermal conductive and electrical insulating character to the composite material filling the cavities.

Thus, the composite material is made of a material compatible in terms of coefficient of thermal expansion CTE with the thin layer (this property also depending on the thickness of the deposit) and adjustable in terms of electrical and thermal properties depending on the added load. This will allow considering for the resulting structure the technological operations involving significant thermal budgets and in particular temperatures that may rise up to 1,000° C. or even beyond.

The composite material may be different depending on the filled cavities, so that the integration of other electronic components of different functions is possible on the composite structure.

According to other features, the structure of the present invention includes one or more of the following optional features considered alone or in combination:
- The first material, that is to say the material of the support substrate, is a semiconductor material, such as silicon.
- the first material is monocrystalline silicon.
- the first material is polycrystalline or amorphous silicon.
- the first material comprises SiC, Ge, InP, and/or GaAs.
- The support substrate has a thickness comprised between 10 micrometers and 1 mm.
- The support substrate is a standard silicon wafer (wafer). It typically has a thickness of 725 micrometers for a diameter of 200 mm.
- The depth of each of the cavities is strictly less than the thickness of the support substrate.
- The donor substrate or the thin film is made from a second monocrystalline material, semiconductor material, such as silicon, SiC, Ge, InP, or GaAs or having piezoelectric properties, such as PZT, $BaTiO_3$, $LiNbO_3$, quartz, or $LiTaO_3$.
- The crystalline quality of the support substrate is less than that of the thin film.
- The thickness of the thin film is comprised between 10 nm and 2 micrometers when it is obtained by formation of an embrittlement plane in a donor substrate, followed by a fracture.
- The thickness of the thin film is at least 100 micrometers when it is obtained by thinning by grinding of a thicker donor substrate (term commonly used by the person skilled in the art to refer to grinding or rectification).

The second material of the thin film serves as a seed layer for epitaxial growth during the partial or total manufacture of components.

The inorganic particles charged in the matrix have a diameter ranging from a nanometer to several micrometers.

The thin film is bonded by direct bonding, i.e. by molecular adhesion, with the support substrate and the composite material.

Layers of $Si_xO_y$ and/or of $Si_xN_y$ are deposited at the bonding interface to promote direct bonding. These layers have a thickness comprised between 0.1 and 5 micrometers.

The thin film is bonded by metallic bonding with the support substrate and the composite material.

Metallic layers of Cu, Ag and/or W are deposited at the bonding interface to promote metallic bonding.

The thin film is bonded by hybrid bonding with the support substrate and the composite material.

The thin film is bonded by «Surface Activated Bonding» SAB bonding (for ion activation under ultra-high vacuum) with the support substrate and the composite material.

Prior achieving contact for bonding, chemistry is carried out on the surfaces in order to eliminate residual particles and native oxides.

In the case of direct bonding, plasma techniques ($O_2$ or $N_2$ plasma), UV/ozone and Megpie are used.

According to another aspect, the invention provides a method for manufacturing a composite structure intended for a planar co-integration, the method comprising the steps of:

a) providing a support substrate made of a first material, comprising an upper face, the support substrate comprising cavities opening into the upper face,
b) filling the cavities with a filling formulation comprising a matrix of a preceramic polymer, the matrix being charged with inorganic particles,
c) applying a crosslinking treatment so as to obtain a composite material consisting of the matrix of the crosslinked preceramic polymer, charged with inorganic particles,
d) bonding a donor substrate made of a second material to the upper face of the support substrate and to the composite material, and
e) thinning the donor substrate to form a thin film.

The filling of the cavities with the filling formulation is carried out by any common microelectronics technique. It may be obtained by screen-printing or by inkjet or by any method in accordance with the dimensions of the cavities. In the case where the filling formulation is in solid form and in particular granulated powders or granules, the latter may be dispensed into cavities by extrusion using a syringe (type of robocasting method).

According to one arrangement, the crosslinking treatment comprises a heat treatment.

In the case where the filling formulation comprises a solvent, step c) of applying a crosslinking treatment comprises beforehand an evaporation heat treatment at a lower temperature than that of the crosslinking heat treatment so as to enable the evaporation of the solvent from the filling formulation.

According to one variant, the application of the crosslinking treatment comprises the application of a temperature ramp making it possible to carry out the thermal evaporation treatment. The temperature ramp is carried out with or without a leveling off depending on the nature of the used solvent and its amount so as to evaporate all of the solvent.

According to one possibility, step d) of bonding is preceded by a step i) of planarization of the upper surface of the support substrate and/or of an exposed surface of the composite material, so that the exposed surface and the upper surface extend in a single plane and form a surface suited for bonding.

Step i) of planarization comprises a step of grinding and/or of applying chemical-mechanical polishing so as to present a surface of the desired roughness depending on the type of bonding. The roughness will be, for example, less than 0.5 nm RMS for performing direct bonding.

According to one arrangement, step d) of bonding is preceded by a step j) of deposition comprising the formation of an adhesion primer on the upper surface of the support substrate and on the exposed surface of the composite material and/or on the donor substrate, so as to facilitate bonding.

In this case, step i) of planarization is less restrictive, it is even sometimes possible to avoid it depending on the initial roughness of the surfaces.

The adhesion primer formed on the surface(s) before bonding has a thickness of less than 10 micrometers. This allows leveling the surfaces without having a negative impact on the properties of the composite structure.

According to one possibility, the method comprises performing a step k) of preparing the upper face between step b) and step c) comprising:
the arrangement and holding of a covering element against the upper face of the support substrate, covering at least the cavities,
the flip of the support substrate, so that the filling formulation comes by gravity flush with the plane of the upper face of the support substrate.

Positioned in this manner, the matrix is placed against the inner wall of the covering element or remains in its initial position in which it is flush with the plane of the upper face of the support substrate before crosslinking, depending on the charging of the cavity. Under these conditions, the shrinkage of the composite material linked to the evaporation of the solvent or the crosslinking does not affect the difference in level between the plane of the exposed surface of the composite material and that of the upper face of the support substrate.

It should be understood in this document that the flip leads to the inversion of the position of the upper face with that of the base of the support substrate.

Once the crosslinking has been carried out according to step c), the support substrate is flipped to its initial position, the upper face oriented upwards. The covering element is removed. The exposed surface of the composite material and the upper face form a single plane forming a surface suitable for bonding. Indeed during the crosslinking of the polymer, interactions have occurred between the matrix and the surfaces of the cavity so that the composite material remains in the position taken at the time of the crosslinking despite the possible shrinkage.

According to one possibility, at least one through hole is formed beforehand in the support substrate so as to allow the evaporation of any solvent of the composite formulation, from the cavity towards the base of the support substrate oriented upwards.

The covering element comprises for example an adhesive film or a back-plate, held against the upper face of the support substrate.

The bonding surface formed in this manner is planarized according to step i) where necessary. A deposit of an adhesion primer according to step j) is also possible separately or in combination.

Other aspects, objects and advantages of the present invention will appear better upon reading the following description of the different variants thereof, given as non-limiting example and made with reference to the appended drawings. The figures do not necessarily comply with the scale of all of the elements represented so as to improve readability thereof.

In the rest of the description, for the sake of simplification, identical, similar or equivalent elements of the different embodiments bear the same reference numerals in which:

FIG. 1 represents a step of the method according to a first embodiment of the composite structure 100 according to the present invention.

FIG. 2 represents a step of the method according to the first embodiment of the present invention.

FIG. 3 represents a step of the method according to the first embodiment of the present invention.

FIG. 4 represents a step of the method according to the first embodiment of the present invention.

FIG. 5 represents a step of the method according to the first embodiment of the present invention.

FIG. 6 represents a step of the method according to the first embodiment of the present invention.

FIG. 7 illustrates a step of the method according to a second embodiment of the composite structure 100 of the present invention.

FIG. 8 illustrates a second step of the method according to the second embodiment of the present invention.

FIG. 9 illustrates a third step of the method according to the second embodiment of the present invention.

As illustrated in FIG. 1, a support substrate 1 made of a first semiconductor material, such as a 725 micrometers thick silicon wafer, is first provided according to step a) of the method. It includes a plurality of cavities 2 each opening into the upper face 3 of the support substrate 1.

These cavities 2 have been formed beforehand, for example by a method comprising a masking step including the deposition of a photolithography resin over the regions of the support substrate 1 to be preserved, followed by a step of deep etching by RIE of the unmasked regions. According to one alternative, the cavities 2 are obtained thanks to the use of a laser until reaching a depth of about 100 micrometers and a section of 1×1 mm².

As illustrated in FIG. 2, the cavities 2 are then filled with a filling formulation comprising a matrix 4 of a preceramic polymer charged with inorganic particles according to step b) of the method. The charging or filling of the cavities 2 is carried out while the upper face 3 of the support substrate 1 still comprises the photolithography resin so as to protect the surface. According to one variant, the protection is obtained by an adhesive film of the cutting sticky type or a screen-printing stencil.

According to one possibility, the filling formulation comprises polysiloxane polymer SILRES® H62 C. According to another arrangement, the polymer is polycarbosilane SMP-10 supplied by Starfire.

The inorganic particles consist of $Si_3N_4$ and/or of AlN so as to confer thermal and electrical insulation properties on the composite material. The charge rate is about 60% of the total volume of the formulation.

A solvent, such as xylene, butan-2-one or Diestone DLS, is added to the matrix 4 so as to adapt the viscosity and obtain a liquid filling formulation.

Afterwards, filling of the cavities 2 with the filling formulation is obtained according to step b) of the method by screen-printing.

A crosslinking treatment according to step c) of the method is carried out by applying a heat treatment at about 200° C. when the polymer is SILRES® H62 C. This heat treatment also contributes to the evaporation of the solvent (visible in FIG. 3). A composite material 5 is then obtained in the cavities 2.

According to one possibility, the filling formulation comprises at most 30% by weight of solvent so as to have very good fluidity. Nonetheless, such an amount of solvent generates a significant shrinkage (or loss of volume) of composite material 5 once the solvent has evaporated and the preceramic polymer has been crosslinked. In order to obtain satisfactory filling of the cavities 2, a sequence comprising a heat treatment at a temperature lower than that of the crosslinking and the charging of the cavity with the filling formulation is repeated several times, so as to fill at least to 95% the volume of the cavities 2 with the composite material 5. This filling rate reduces the subsequent steps of planarization or of preparation of the surfaces for an optimal bonding with the thin film.

According to one variant that is not illustrated, the filling formulation is solid. The preceramic polymer is SILRES® MK, it is dissolved in a solvent in order to be mixed with $Si_3N_4$ particles. Afterwards, the whole is dried to obtain a powder (filling formulation) used to fill the cavities 2. A crosslinking heat treatment allows obtaining the composite material 5. According to another variant, the solid preceramic polymer is heated up to its melting temperature (lower than its crosslinking temperature) in order to be mixed with the inorganic particles. Once the formulation has cooled and solidified, it is ground in order to be introduced into the cavities 2.

As represented in FIG. 4, after removal of the photolithography resin or the adhesive film, an adhesion primer 6 is deposited on the upper face 3 of the support substrate 1 and the exposed surface of the composite material 5 according to step j) of the method so as to avoid very important steps of grinding/planarization of the surfaces before bonding. This adhesion primer 6 consists of a preceramic polymer with thermoplastic behavior such that once deposited and heated up to its softening temperature, it allows bonding to a donor substrate according to step d) of the method.

According to one possibility illustrated in FIG. 5, the adhesion primer 6 is also deposited on the donor substrate 7 before step d) of bonding. Alternatively, it may only be deposited on this donor substrate and not on the upper face of the support substrate 1.

According to another not illustrated possibility, the bonding according to step d) is carried out by the prior deposition of a thin layer of amorphous silicon bombarded with argon (SAB bonding).

According to still another variant, the bonding does not use an adhesion primer 6. The face of the support substrate 1 and an exposed surface of the composite material 5 are planarized by grinding and chemical-mechanical polishing (CMP) steps. so as to form a single plane, forming a surface adapted for subsequent bonding. For example, in preparation for direct bonding, said surface is polished until it has a roughness of less than 0.5 micrometer RMS. The area hardened by grinding has been removed.

As visible in FIG. 5, the donor substrate 7 has a weakening plane 8 obtained prior to bonding by implantation of ionic species according to Smart Cut® technology. Once the bonding has been carried out, the thin film 9 is separated from the negative of the donor substrate 7 by applying a thermal fracture budget according to step e) of the method. This may be reduced by the concomitant application of a mechanical stress at the level of the weakening plane 8.

Preferably the donor substrate 7 and/or the thin film 9 consists of a monocrystalline material.

Layers of SixOy oxides are deposited by PEVCD on the surfaces to be bonded to a thickness of about 100 nm for direct bonding of the support substrate 1 and of the donor substrate 7. A CMP step is carried out on the layers of oxides to find the surface roughness necessary for direct bonding, for example 0.3 micrometer RMS. After bringing the surfaces into contact, a bonding anneal reinforcing the bonding energy between the donor substrate 7 and the support substrate 1 is applied. This annealing advantageously provides the thermal budget necessary for the fracture of the donor substrate 7 at the level of the weakening plane 8 and releases the thin film 9 bonded to the support substrate 1. The surface of the thin film 9 is polished and cleaned for the manufacture of the electronic components 10,11 (FIG. 6)

According to another alternative, the non-weakened donor substrate 7 is thinned by a grinding step, which may be combined with chemical etching, until the desired thickness of the thin film 9 is reached. Then a mechanical-chemical polishing is carried out in particular to obtain a surface of the thin film 9 adapted for epitaxial growth of a new material. The composite structure 100 thus obtained is capable of a planar co-integration of different electronic components on regions with different properties depending on whether they are located on the composite material 5 or on the first material. (Microelectronic system 200 with a planar co-integration in FIG. 6).

According to a variant of the method illustrated in FIGS. 7 to 9, once the filling formulation is introduced into the cavities 2, a covering element 12, such as a back-plate, is placed against the upper face 3 of the support substrate 1 of so as to cover the cavities 2. The support substrate 1 is then flipped such that its upper face 3 is oriented downwards and its base is oriented upwards, the back-plate 12 maintaining the formulation in the cavity 2 (FIG. 7). In this position, the filling formulation 4 comes into contact with the inner wall of the back-plate 12 so as to be flush with the plane of the upper face 3 of the support substrate 1. The crosslinking treatment is applied so that the polymer of the composite formulation is cross-linked in this position. Once the support substrate 1 has been flipped to its initial position, the exposed surface of the composite material 5 is flush with the plane of the upper face 3 (FIG. 8). A single plane is thus formed, which limits the stages of planarization or preparation of the surfaces before bonding (FIG. 9).

According to one possibility illustrated in FIG. 7, through holes 13 are formed beforehand through the thickness of the support substrate 1 so as to allow the evaporation of the solvent of the filling formulation, if necessary, from the cavities 2 towards the exterior of support substrate 1.

The back-plate 12 is then removed, a direct bonding with oxide layers 14 is carried out so as to obtain composite structure 100. Different electronic components are formed on the different regions of the thin film 9 depending on whether the regions are overlying cavities 2 or the first material.

The composite structure 100 of the present invention thus allows the facilitated co-integration of components of different functions while improving their performance thanks to an underlying substrate configured to present the appropriate properties. These structures 100 allow achieving more compact systems 200, requiring fewer manufacturing steps than those known to date.

The invention claimed is:

1. A composite structure, intended for planar co-integration of electronic components of different functions, the composite structure comprising from its base towards its surface:
    a support substrate made of a first semiconductor material, the support substrate including cavities each opening into an upper face of the support substrate, the cavities being filled with at least one composite material consisting of a matrix of a crosslinked preceramic polymer, the matrix being charged with inorganic particles,
    a thin film made of a second semiconductor or piezoelectric material, the thin film being bonded to the upper face of the support substrate and to the composite material.

2. The composite structure according to claim 1, wherein the cavities have a depth larger than or equal to 10 micrometers.

3. The composite structure according to claim 1, wherein the preceramic polymer is a silicon-based polymer, selected from the group consisting of: a polysiloxane, a polysilsesquioxane, a polycarbosiloxane, a polycarbosilane, a polysilylcarbodiimide, a polysilsesquicarbodiimide, a polysilsesquiazane, a polysilazane, a polyborosilazane, a polyborosilane, a polyborosiloxane and a combination of these polymers.

4. The composite structure according to claim 1, wherein the matrix is charged with one or several type(s) of inorganic particles, selected from:
    a thermal conductor,
    an electrical insulator,
    an electrically-conductive metal,
    a magnetic material,
    a material with an optical property,
    and a combination of these different types of inorganic particles.

5. The composite structure according to claim 1, wherein the matrix is obtained from a filling formulation, comprising between 20% and 50% by volume of a preceramic polymer and a charge rate of inorganic particles ranging from 50 and 80% by volume with respect to the total volume of the filling formulation.

6. The composite structure according to claim 1, wherein the thin film is bonded to the upper face of the support substrate and to the composite material through an adhesion primer disposed on the upper face of the support substrate and on an exposed surface of the composite material filling the cavities.

7. A micro-electronic system with planar co-integration comprising:
    a composite structure according to claim 1,
    a plurality of electronic components of different functions on the thin film comprising:
        passive electronic components formed on first regions of the exposed surface of the thin film located directly in vertical alignment with the composite material filling the cavities of the support substrate,
        active electronic components formed on second regions of the exposed surface of the thin film located directly in vertical alignment with the first material of the support substrate, the inorganic particles of the matrix consist of SiC and/or $Si_3N_4$ to confer a thermally conductive and electrically insulating nature on the composite material filling the cavities.

* * * * *